(12) United States Patent
Tsyrganovich et al.

(10) Patent No.: US 10,069,485 B2
(45) Date of Patent: Sep. 4, 2018

(54) HIGH-SPEED MOSFET AND IGBT GATE DRIVER

(71) Applicant: IXYS Corporation, Milpitas, CA (US)

(72) Inventors: Anatoliy V. Tsyrganovich, Woodside, CA (US); Leonid A. Neyman, Sunnyvale, CA (US)

(73) Assignee: IXYS, LLC, Milpitas, CA (US)

( * ) Notice: Subject to any disclaimer, the term of this patent is extended or adjusted under 35 U.S.C. 154(b) by 0 days.

(21) Appl. No.: 15/423,421

(22) Filed: Feb. 2, 2017

(65) Prior Publication Data
US 2018/0219532 A1    Aug. 2, 2018

(51) Int. Cl.
*H03K 3/012*    (2006.01)
*H03K 19/0185*  (2006.01)

(52) U.S. Cl.
CPC ..... *H03K 3/012* (2013.01); *H03K 19/018507* (2013.01)

(58) Field of Classification Search
CPC ........... H03K 3/012; H03K 19/018507; H03K 19/018521; H03K 19/017509
See application file for complete search history.

(56) References Cited

U.S. PATENT DOCUMENTS

| | | | |
|---|---|---|---|
| 6,992,520 B1 | 1/2006 | Herbert | 327/377 |
| 7,782,098 B2 * | 8/2010 | Hashimoto | H02M 3/07 327/108 |
| 8,018,255 B2 * | 9/2011 | Hirao | H02M 3/158 257/288 |
| 8,203,377 B2 | 6/2012 | Kelley et al. | 327/427 |
| 8,890,596 B2 * | 11/2014 | Chen | H03K 3/013 327/293 |
| 2017/0187372 A1 * | 6/2017 | Perruchoud | H01L 29/7827 |

OTHER PUBLICATIONS

Application Note, EICE Driver, 1ED Family Technical Description, Infineon Technologies AG, Munich, Revision 1.4, Jul. 1, 2014 (26 pages).
White Paper, Mitigation Methods for Parasitic Turn-on Effect due to Miller Capacitor, Avago Technologies, AV02-0599EN Mar. 3, 2010 (3 pages).

* cited by examiner

*Primary Examiner* — Jung Kim
(74) *Attorney, Agent, or Firm* — Imperium Patent Works; T. Lester Wallace; Darien K. Wallace

(57) ABSTRACT

A gate driver integrated circuit drives an output signal onto its output terminal and onto the gate of a power transistor. In a turn-on episode, a digital input signal transitions to a digital logic high level. In response, the gate driver integrated circuit couples the output terminal to a positive supply voltage terminal, thereby driving a positive voltage onto the gate of the power transistor. In response to a high-to-low transition of the digital input signal, the driver drives a negative voltage onto the output terminal and power transistor gate for a short self-timed period of time, and then couples the output terminal to a ground terminal, thereby driving the output terminal and power transistor gate up to ground potential. The output terminal and power transistor gate are then held at ground potential in anticipation of the next turn-on episode of the power transistor.

16 Claims, 9 Drawing Sheets

GATE DRIVER INTEGRATED CIRCUIT

GATE DRIVER INTEGRATED CIRCUIT

DELAY CIRCUIT

LEVEL SHIFTER

GATE DRIVER INTEGRATED CIRCUIT

HIGH-SPEED MOSFET AND IGBT GATE DRIVER

TECHNICAL FIELD

The described embodiments relate to gate drivers for driving the gates of transistors such as power field effect transistors (so-called MOSFETs) and power Insulated Gate Bipolar Transistors (IGBTs).

BACKGROUND INFORMATION

In the design of switching power supplies, such as AC-to-DC switching power supplies in the 5 kW to 10 kW range usable in driving the motors of commercial air conditioners, there has always been a general desire to reduce the cost of the power supply. Despite this, power supply designs continue to have certain characteristics and standard design aspects. Cost often remains undesirably high, despite the desire to reduce it, because how to reduce the power supply manufacturing cost has been, and continues to be, an unknown and nonobvious thing. There are many different parts and aspects of a power supply to be focused on and to which effort can be devoted in the quest to reduce cost. Changing the design of one part of the circuit may actually serve to increase the cost of another part of the circuit. Reducing cost in certain respects may not be possible due to associated reductions in performance of the power supply. How to reduce overall power supply cost while still meeting performance or reliability and other requirements on the power supply is difficult.

It is known that the size of the magnetic component or components of many power supply circuits can often be reduced if the magnetics of the power supply can be made to switch at a higher frequency. But just increasing the frequency at which the power supply is switched would not reduce power loss in the short transient switching periods. There is a time when a switching transistor of a power supply is being turned on. It is initially substantially non-conductive, and then after the transient time it is considered to be on and substantially conductive. But during the intervening transient time, it has an appreciable non-zero resistance which due to current flow through the transistor at that time translates into power losses. Similarly, there is a time when a switching transistor of a power supply is being turned off. It is initially on and is substantially conductive, and then after the transient time it becomes nonconductive and is considered to be off. But during the intervening transient time, it has an appreciable non-zero resistance which translates into power losses. If the actual switching of the transistor could be made faster, then power loss during these transient times could be reduced. The associated reductions in power losses might serve to reduce the cost of heat sinks and/or fans and other parts of the power supply that would be otherwise necessary for removing unwanted heat from the power supply. Despite it being known in the art that there are such undesirable power losses during transient switching conditions, knowledge of how to reduce or eliminate these losses in a commercially-realistic way has remained elusive and unknown.

SUMMARY

A gate driver integrated circuit has an input terminal, an output terminal, a positive supply voltage terminal, and a ground terminal. In some embodiments, the gate driver integrated circuit also has a pair of terminals for coupling the gate driver integrated circuit to an external charge pump capacitor. In some embodiments, the gate driver integrated circuit also has a negative supply voltage terminal. The gate driver integrated circuit is for driving the gate of a power transistor such as a discrete power N-channel Field Effect Transistor NFET (also called a power MOSFET) or a discrete packaged power Insulated Gate Bipolar Transistor (IGBT). In addition to these terminals, the gate driver integrated circuit also has an active pullup circuit, an active pulldown circuit, and an active grounding circuit. The output terminal of the gate driver integrated circuit is to be coupled (for example, by a conductor on a printed circuit board) to the gate of the power transistor to be driven. A control circuit, such as a microcontroller, drives a digital logic input control signal (for example, through a conductor on the printed circuit board) onto the input terminal of the gate driver integrated circuit. When the digital logic input control signal is high (at a digital logic high voltage level such as +3.3 volts), then the gate driver integrated circuit is to output a voltage onto the gate of the power transistor that causes the power transistor to be turned on. When the digital logic input control signal is low (at a digital logic low voltage level such as zero volts), then the gate driver integrated circuit is to output a voltage onto the gate of the power transistor that causes the power transistor to be turned off.

A high pulse of the digital logic input control signal driven onto the input terminal of the gate driver integrated circuit is considered to involve three periods of time: a first period of time, a second period of time, and a third period of time. The digital logic input control signal has the digital logic high level during the first period of time and transitions to the digital logic low level at the end of the first period of time so that the digital logic input control signal has the digital logic low level during the second period of time. The digital logic input control signal does not transition digital logic levels between the second period of time and a third period of time such the digital logic input control signal maintains the digital logic low level into and throughout the third period of time.

At the beginning of the first period of time when the digital logic input control signal initially transitions from low to high at the beginning of the high pulse, the active pullup circuit couples to the output terminal to the positive supply voltage terminal. This condition is then maintained throughout the remainder of the first period of time. This driving of the output terminal to the positive voltage (for example, +15 volts) causes the positive voltage to be driven onto the gate of the power transistor and causes the power transistor to be turned on and to stay on.

The digital logic input control signal then transitions from high to low at the end of the first period of time (at the beginning of the second period of time). In response to the digital logic input control signal on the input terminal transitioning from the digital logic high level to the digital logic low level at the beginning of the second period of time, the active pulldown circuit drives the output terminal to a negative voltage (for example, −15 volts). This driving of the output terminal to the negative voltage causes the external power transistor to be turned off and to stay off. The voltage on the gate of the external power transistor is therefore being pulled down to the negative voltage. The negative voltage on the gate of the power transistor may initially ring and oscillate around the negative voltage, but the oscillations die down over time. At the end of the second period of time, the voltage on the output terminal is a negative voltage.

Next, the active grounding circuit couples the output terminal to the ground terminal during the third period of time while the digital logic low level is still present on the input terminal. This condition of the active grounding circuit coupling the output terminal to the ground terminal persists throughout the remainder of the third period of time. The voltage on the gate of the external power transistor that was at the negative voltage at the beginning of the third period of time is at zero volts by the end of the third period of time. Because ground potential is below the threshold voltage $V_{TH}$ of the external power transistor, the external power transistor remains off throughout the second and third periods of time. At the beginning of a turn off episode, by initially driving the gate of the external transistor to the negative voltage (for example, −15 volts) and then raising the voltage on the gate of the external transistor up to ground potential (zero volts) before the next turn-on episode, the switching speed of the external transistor is increased.

In a first example of the novel gate driver integrated circuit, the gate driver integrated circuit has no negative supply voltage terminal. The gate driver integrated circuit uses a capacitor along with an on-chip charge pump circuit to generate the negative voltage. The capacitor is charged during the first period of time. During the second period of time, the active pulldown circuit uses the negative voltage as provided by the charged capacitor to supply the negative voltage onto the output terminal of the gate driver integrated circuit. The active pulldown circuit is said to drive the output terminal to the negative voltage. As described above, the negative voltage on the gate of the power transistor may initially ring and oscillate around the negative voltage, but the oscillations die down over time such that a negative voltage is on the gate of the external transistor at the end of the second period of time.

In a second example of the novel gate driver integrated circuit, the gate driver integrated circuit has a negative supply voltage terminal. A voltage source external to the gate driver integrated circuit maintains the negative voltage on this terminal. During the second period of time, the active pulldown circuit drives the output terminal to the negative voltage by coupling the output terminal to the negative supply voltage terminal.

In some embodiments, the novel gate driver integrated circuit has no active grounding circuit but rather during the third period of time the gate of the external power transistor is charged from the negative voltage up to ground potential by a resistor. One lead of the resistor is coupled to a ground conductor or node, whereas the other lead of the resistor is coupled to the output terminal. During the third period of time neither the active pullup circuit nor the active pulldown circuit is driving the output terminal. The resistor may be integrated on the gate driver integrated circuit die or may be external to the gate driver integrated circuit die.

Further details and embodiments and methods and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to embodiments of the invention, examples of which are illustrated in the accompanying drawings.

Figure 1:
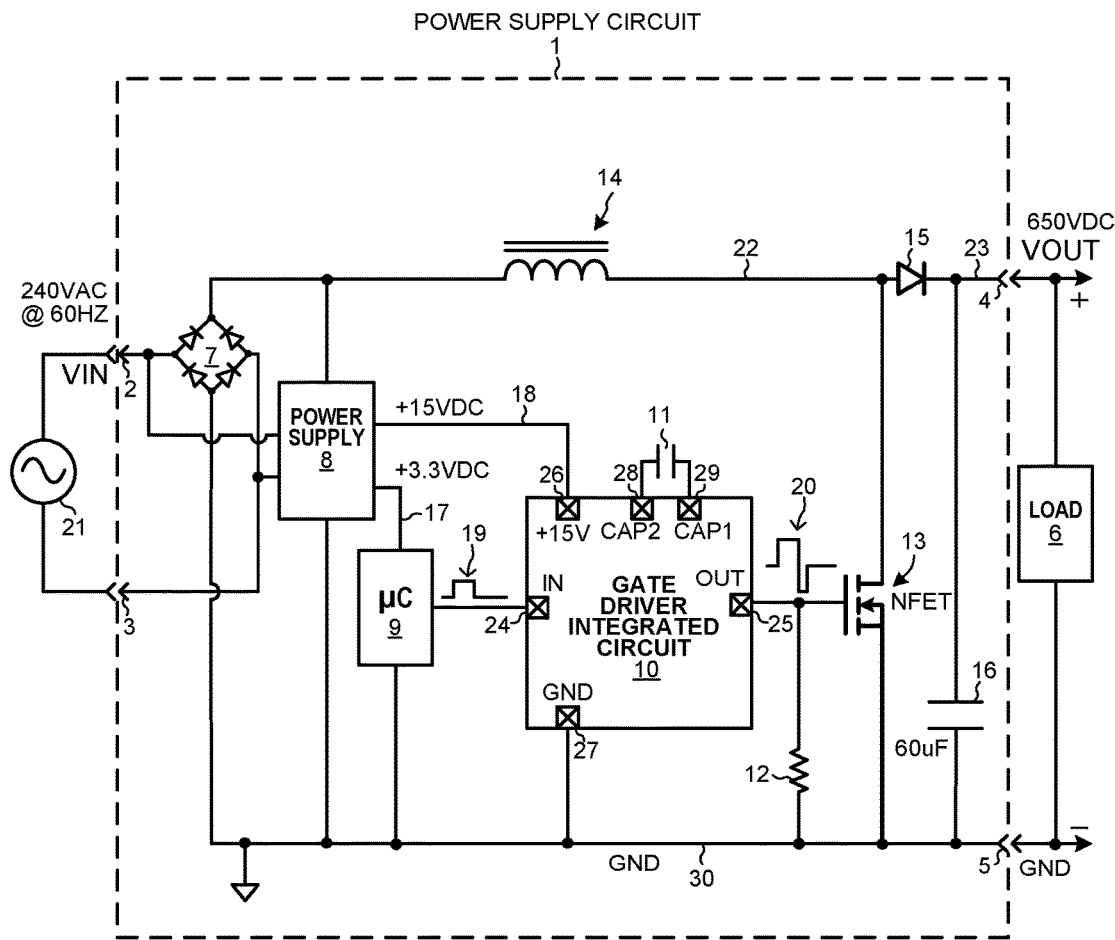
FIG. 1 is a diagram of an AC-to-DC power supply circuit 1 in accordance with one novel aspect.

FIG. 1 is a diagram of an AC-to-DC power supply circuit 1 in accordance with one novel aspect. The power supply circuit 1 receives power via terminals 2 and 3 from a 240 volt AC (RMS), 60 Hertz, power source 21. The 240 volt AC supply voltage that is received from the power source 21 is denoted VIN in the diagram. The power supply circuit 1 outputs 650 volts DC via terminals 4 and 5 to a load 6. This output voltage is denoted VOUT in the diagram. The power supply circuit 1 includes a full bridge diode rectifier 7, another AC-to-DC power supply circuit 8, a microcontroller integrated circuit 9, a novel gate driver integrated circuit 10 as is described in detail below, an external capacitor 11, a resistor 12, an N-channel power Field Effect Transistor (FET) 13 (also sometimes called a power MOSFET), an inductor 14, a rectifying diode 15, and an output storage capacitor 16. The circuit diagram of FIG. 1 is a simplified diagram. Other circuit components, such as those associated with supporting the microcontroller integrated circuit 9, are not illustrated.

The power supply circuit 8 receives power from the 240 volt AC source 21, and outputs a +3.3 volt DC supply voltage onto conductor 17 and also outputs a +15 volt DC supply voltage onto conductor 18. The microcontroller integrated circuit 9 is powered from the +3.3 volt supply voltage. The gate driver integrated circuit 10 is powered from the +15 volt DC supply voltage received onto the gate driver integrated circuit 10 via a +15 volt supply voltage terminal 26. Terminal 27 is a ground terminal. The external capacitor 11 is coupled to circuitry inside the gate driver integrated circuit 10 via terminals 28 and 29. The gate driver integrated circuit 10 is actually a gate driver integrated circuit die. Terminals 24-29 are bond pad terminals of the gate driver integrated circuit die 10. The semiconductor device package that houses the gate driver integrated circuit die 10 is not shown in FIG. 1, but it is understood to be present. For each of the terminals 24-29 of the die, there is a corresponding package terminal on the semiconductor device package. The term integrated circuit can refer to an integrated circuit die and/or to a packaged integrated circuit.

In operation of the power supply circuit 1, the microcontroller integrated circuit 9 outputs a digital control signal 19 onto the IN terminal 24 of the gate driver integrated circuit 10. To turn the power NFET 13 on, the microcontroller integrated circuit 9 causes the digital control signal 19 to have a digital logic high logic level. In the present example, a digital logic high logic level is +3.3 volts. This in turn causes the gate driver integrated circuit 10 to assert a gate driver control signal 20 onto the OUT output terminal 25 and onto the gate of the power NFET 13 such that the power NFET 13 is turned on and becomes conductive. To turn the power NFET 13 off, the microcontroller integrated circuit 9 causes the digital control signal 19 to transition to a digital logic low logic level. In the present example, a digital logic low logic level is zero volts. This in turn causes the gate driver integrated circuit 10 to deassert the gate driver control signal 20 such that the power NFET 13 is turned off and becomes nonconductive. As is known in the art, the power NFET 13 is made to switch on and off rapidly in such a way that there are high voltage pulses on node 22. Associated current pulses pass through the diode 15 so as to maintain the capacitor 16 charged to the desired 650 volts DC. Output voltage detection circuitry by which the microcontroller integrated circuit 9 monitors the output voltage VOUT on output node 23 and terminal 4 is not shown. The pulses of the control signal 19 as output by the microcontroller integrated circuit 9 are generated such that the voltage VOUT is regulated to remain at +650 volts DC over a range of operating parameters of the overall power supply circuit.

Figure 2:
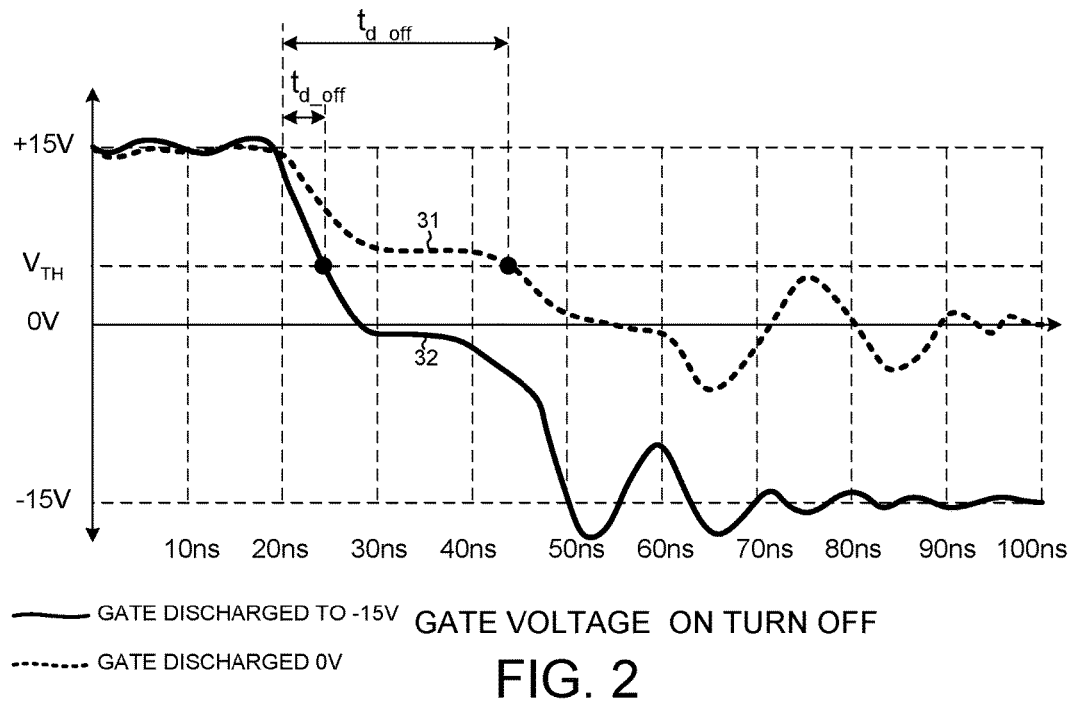
FIG. 2 is a waveform diagram that illustrates how gate voltage changes during a turn off condition.

FIG. 2 is a waveform diagram that illustrates the discharging of the gate of a power NFET, such as NFET 13 of FIG. 1, from a positive gate voltage such as +15 volts down to a voltage lower than the threshold voltage $V_{TH}$ of the transistor so as to turn off the transistor. In one example as is conventionally done, the gate is discharged by coupling it to a ground supply conductor or ground node. The voltage on this ground supply conductor or node is maintained at zero volts. Such a ground conductor or node may, for example, be the ground conductor and node GND 30 of FIG. 1. Due to the coupling of the gate to this ground supply conductor or node, the voltage on the gate decreases and it decreases as indicated by the dashed line 31 of FIG. 2. The rate of discharge is not constant. The capacitance of the gate has several components. One component of the capacitance is due to the semiconductor capacitor of the gate structure of the NFET. The capacitance of this semiconductor capacitor depends on the depletion region in the semiconductor material under the gate and therefore is voltage dependent. As the voltage on the gate decreases, the capacitance actually increases. This causes a commensurate decrease in the rate of decrease of the gate voltage assuming that the impedance between the gate the ground node through which the discharge is occurring remains constant. After a period of time of less rapid decrease in the gate voltage at a voltage slightly above the threshold voltage $V_{TH}$, the gate voltage then begins to decrease again at a somewhat faster rate. The threshold voltage $V_{TH}$ of the transistor is then crossed, and the gate voltage continues to decrease as illustrated in FIG. 2. The voltage on the gate then crosses zero volts, and then may actually ring as illustrated in FIG. 2 due to parasitic inductances. The ringing subsides over time, and the gate voltage eventually settles to zero volts. Although the threshold voltage is illustrated in FIG. 2 to be a single voltage, the so-called threshold is not an abrupt change and there is no precise single threshold voltage. In the example of the transistor illustrated in FIG. 1, the threshold voltage $V_{TH}$ is a voltage in a range of from about 3 volts to about 6 volts. This threshold voltage, or threshold voltage range, roughly speaking is the voltage at which the NFET begins to turn off. If the turn off could be made more rapid, and the time during which the gate voltage is in this general threshold voltage range could be reduced, then power losses in the transistor might be reduced.

In FIG. 2, line 32 illustrates the gate voltage for the same NFET transistor but in a condition in which the gate is coupled to a −15 volt conductor or node, as compared to it being coupled to a ground conductor and node as in the case of line 31. In a case in which the gate is coupled to a −15 volt conductor or node, the voltage on the gate decreases initially at a faster rate. This comparison of the waveforms 31 and 32 presented in FIG. 2 assumes discharge and current flow through the same impedance (impedance between the gate and the node to which the gate is being discharged). The decrease in gate voltage is as shown by line 32 in FIG. 2. After ringing due to parasitic inductances, the voltage on the gate stabilizes at the negative voltage on the negative voltage conductor or node, namely at −15 volts in this example. It is noted that the switching event represented by line 32 is faster as compared to the switching event represented by line 31. There is less time $t_{d\_off}$ in the case of line 32 between the time the gate voltage started to decrease until the threshold voltage is crossed as compared to the case of line 31. If only the turn off condition were of concern, then it might appear to be desirable to discharge the gate of the NFET by coupling it to a −15 volt conductor and node.

Figure 3:
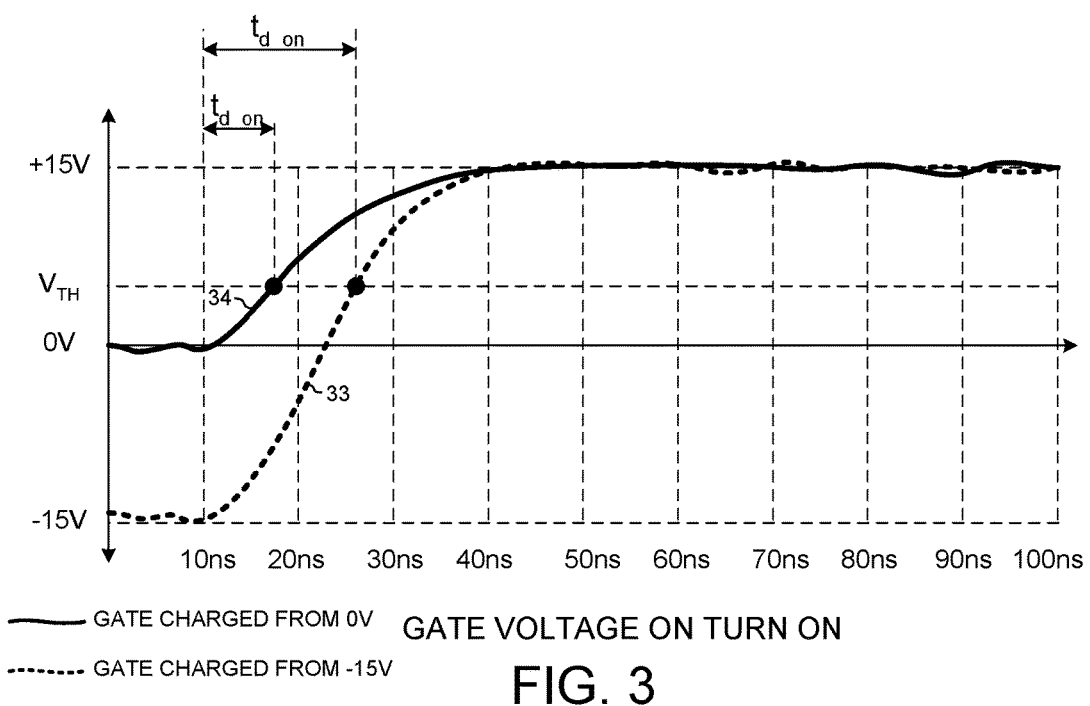
FIG. 3 is a waveform diagram that illustrates how gate voltage changes during a turn-on condition.

The NFET, however, also needs to be turned on. Power losses during the turn-on switching condition also should be taken into account if overall power loss is to be reduced. If the voltage on the gate during turn off times of the NFET is initially at −15 volts, then the turn-on of the NFET is slower as compared to a case in which the starting voltage on the gate is initially zero volts. FIG. 3 is a waveform diagram that illustrates the voltage on the gate of the NFET in a condition in which the starting voltage on the gate is −15 volts during the off time of the transistor. This is represented by line 33. The gate in this case is coupled through an impedance (impedance of the gate driver) to a +15 volt conductor and node. The +15 volt conductor and node in this case might be the conductor 18 of FIG. 1. The voltage on the gate of the NFET rises and the gate is charged by current flow from the +15 volt conductor and node through the impedance to the gate. The shape of the waveform 33 of the rising gate voltage is roughly the familiar RC time constant curve of a charging RC circuit. The final voltage on the gate rises and crosses the threshold voltage $V_{TH}$, and continues upward until it stabilizes at around +15 volts. Line 34 illustrates how the gate voltage would increase for the same circuit, but where the starting voltage is zero volts as opposed to −15 volts. Note that the same RC curve is followed, but that it takes less time for the gate voltage to cross the threshold voltage $V_{TH}$. There is less time $t_{d\_on}$ in the case of line 34 between the time the gate voltage started to increase until the threshold voltage is crossed as compared to the case of line 33. Accordingly, pulling the gate voltage down to −15 volts during a turn off switching episode would leave the off condition voltage on the gate at −15 volts, and this would serve to increase the turn-on time of the NFET the next time the transistor is turned on (as compared to a conventional situation in which the voltage on the gate of the NFET during an off condition is zero volts).

In accordance with one novel aspect of the present invention, when the NFET is to be turned off, the voltage on the gate is pulled down to a negative voltage (for example, −15 volts) so as to achieve the benefit of faster turn-off switching as represented by line 32 of FIG. 2, but then after the ringing of the gate voltage has subsided and the gate voltage has stabilized at the negative voltage (for example, −15 volts), then the voltage on the gate is increased up to about zero volts. The resulting zero volts on the gate is a voltage below the threshold voltage so it still keeps the NFET off. When the NFET is then to be turned on, the starting voltage on the gate is the higher zero volts. The slower turn-on represented by line 33 of FIG. 3 is therefore avoided, and the faster turn-on represented by line 34 of FIG. 34 is achieved. A result of driving the gate of the NFET with this control voltage waveform is reduced power losses in the transistor during the switching episode. Less power consumption may mean that a smaller, and therefore less expensive heat sink can be employed. Less power consumption may mean that a fan may not be required to remove unwanted waste heat from the power supply.

Figure 4:
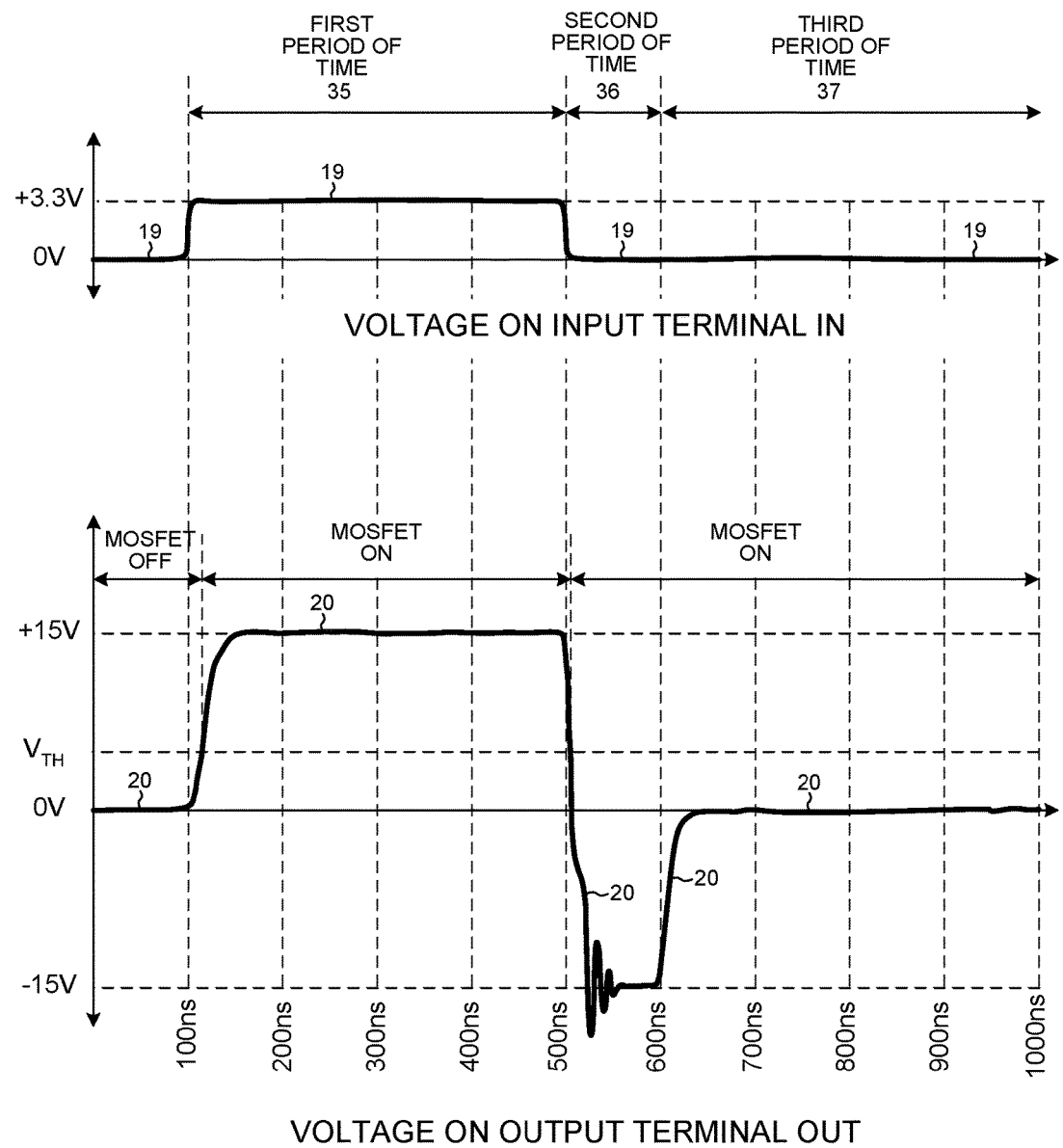
FIG. 4 is a waveform diagram that illustrates the digital logic input control signal on the input terminal of the novel gate driver integrated circuit and that illustrates the voltage on the output terminal of the novel gate driver integrated circuit.

FIG. 4 is a waveform diagram that shows the control signal 19 on the IN input terminal 24 of the gate driver integrated circuit 10 and also shows the resulting control signal 20 as output by the gate driver integrated circuit 10 onto OUT output terminal 25 and onto the gate of NFET 13. There are three time periods of the switching of the control signal 19 shown in FIG. 4: a first period of time 35, a second period of time 36, and a third period of time 37. The first period of time 35 is a period of time starting at a rising edge of the control signal 19. This rising edge is caused by the microcontroller integrated circuit 9 asserting the control signal 19 in order to turn on the NFET 13. The first period of time 35 ends at the next falling edge of the control signal 19. This falling edge is caused by the microcontroller integrated circuit 9 deasserting the control signal 19 in order to turn off the NFET 13. The period of time between the falling edge of the control signal 19 and the next rising edge of the control signal 19 entails two periods of time, the second period of time 36 and the third period of time 37. The second period of time 36 is of a substantially fixed duration as determined by the gate driver integrated circuit 10. The second period of time is self-timed by the gate driver integrated circuit 10. It is of sufficient duration that the ringing of the gate voltage has subsided before the second period of time 36 has ended. In the present example, the second period of time 36 is about one hundred nanoseconds. The third period of time 37 immediately follows the second period of time 36 and extends until the next rising edge of the control signal 19. As illustrated in FIG. 4, the input control signal 19 is at its high digital logic level of +3.3 volts during the first period of time 35, and is at its low digital logic level of zero volts during the second and third periods of time 36 and 37. The digital logic level of the input control signal 19 does not transition digital logic levels at any time between the falling edge of the control signal 19 at the end of the first period of time 35 and the next rising edge of the control signal 19 at the end of the third period of time 37. This cycle of the input control signal 19 involving the three periods of time defines a pulse, and this cycle repeats over and over again as the power supply circuit operates. The duration between pulses and/or the duration of each high pulse is controlled over time in order to maintain the desired target VOUT voltage between the power supply output terminals 4 and 5.

The waveform at the bottom of FIG. 4 illustrates the control signal 20 as output by the gate driver integrated circuit 10 as a result of receiving the input control signal 19 shown at the top of FIG. 4. The control signal 20 is output onto the OUT terminal 25 of the gate driver integrated circuit 10. The rising edge of the input control signal 19 as shown in the top waveform of FIG. 4 causes the output signal 20 to transition from zero volts up to +15 volt positive supply voltage as shown in the lower waveform of FIG. 4. The output voltage of the output signal 20 remains at this high voltage of +15 volts until the next falling edge of the input control signal 19. In response to the next falling edge of the input control signal 19, the output signal 20 is made to transition down from +15 volts to the negative supply voltage of −15 volts. The voltage of the output control signal 20 remains at this negative voltage until the ringing of the gate voltage subsides. When the predetermined period of time 36 has expired, then the voltage of the output control signal 20 is made to transition up from −15 volts to ground potential (to zero volts). The voltage of the output control signal 20 remains at zero volts until the next rising edge of the input control signal 19. Accordingly, in response to the high-to-low transition of the input control signal 19, the gate driver integrated circuit 10 causes the gate of the NFET to be discharged to the −15 volt negative voltage, and this condition is maintained for a short amount of time (for example one hundred nanoseconds) as self-timed by the gate driver integrated circuit 10, after which time the gate driver integrated circuit 10 drives the gate of the NFET to zero volts in anticipation of the next attempt to turn the NFET on.

During the first period of time 35, and in response to the low-to-high transition of input control signal 19, the gate driver integrated circuit 10 drives the gate of the NFET 13 to +15 volts. In one example, it does this by coupling the OUT output terminal 25 to the +15 volt positive supply voltage terminal 26. It is recognized that during the very first part of the first period of time 35, that the gate has not yet been charged and the NFET is still off. It is nevertheless said that the gate driver integrated circuit 10 drives the gate of the NFET to +15 volts during this first period of time 35.

During the second period of time 36, and in response to the high-to-low transition of input control signal 19, the gate driver integrated circuit 10 drives the gate of the NFET 13 to −15 volts. In one example, it does this by charging external capacitor 11 during the first period of time 35. At the beginning of the second period time 36 it then couples the charged capacitor 11 and the CAP2 terminal to the OUT output terminal 25. The charged external capacitor 11 then provides the charge necessary to discharge the gate down to −15 volts. Due to this charge pump action of the external capacitor 11, the gate driver integrated circuit 10 advantageously does not need to be supplied with the negative supply voltage in order to be able to drive the gate to the negative voltage (−15 volts) during the second period of time 36. The term "drive" is used broadly and colloquially here to describe how the voltage on the output terminal OUT is pulled downward even though in this circuit example the negative voltage on the CAP2 terminal 28 becomes less negative over time as the third period of time progresses. It is recognized that during the very first part of the second period of time 36, that the gate of the NFET has not yet been discharged and the NFET is still on. It is nevertheless said that the gate driver integrated circuit 10 "drives" the gate of the NFET to −15 volts during this second period of time 36.

During the third period of time 37, and in response to a time out of a delay circuit within the gate driver integrated circuit 10, the gate driver integrated circuit 10 drives the gate of the NFET 13 to ground potential (zero volts). In one example, it does this by coupling the OUT output terminal 25 to the ground terminal GND 27. Again, it is recognized that during the very first part of the third period of time 37, that the gate is initially at −15 volts and has not yet been charged up to zero volts. It is nevertheless said that the gate driver integrated circuit 10 drives the gate of the NFET to ground potential (zero volts) during this third period of time 37.

Figure 5:
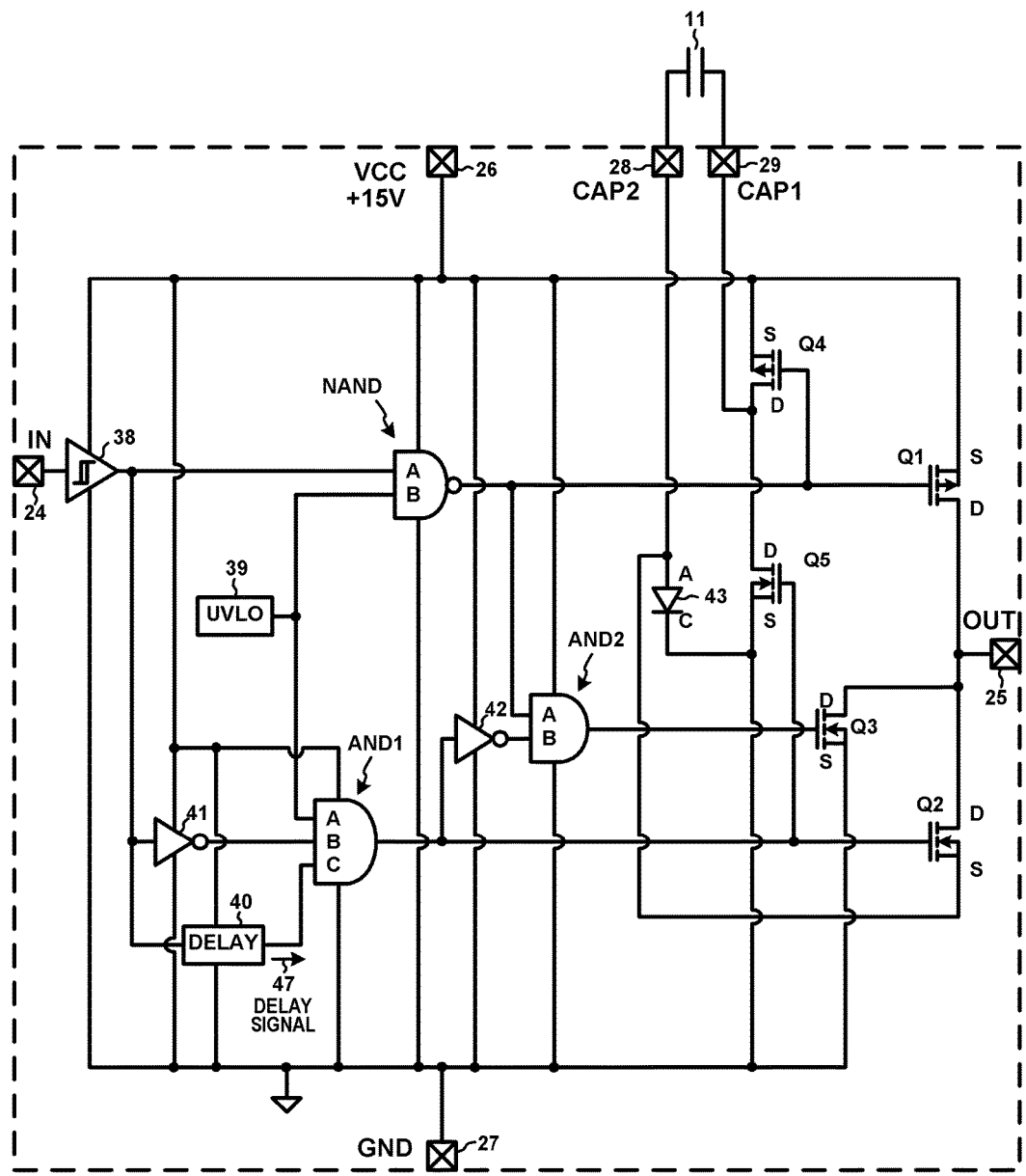
FIG. 5 is a circuit diagram of one example of the novel gate driver integrated circuit of the AC-to-DC power supply circuit of FIG. 1.

FIG. 5 is a circuit diagram of one embodiment of the gate driver integrated circuit 10 of FIG. 1. The gate driver integrated circuit 10 includes a Schmidt trigger non-inverting buffer 38, an UnderVoltage LockOut (UVLO) circuit 39, a delay circuit 40, a NAND gate that is labeled NAND, an first AND gate that is labeled AND1, a second AND gate that is labeled AND2, a pair of inverters 41 and 42, a diode 43, a first field effect transistor that is a P-channel transistor labeled Q1, a second field effect transistor that is an N-channel transistor labeled Q2, a third field effect transistor that is an N-channel transistor labeled Q3, a fourth field effect transistor that is a P-channel transistor labeled Q4, and a fifth field effect transistor that is an N-channel transistor labeled Q5. The circuitry of the gate driver integrated circuit 10 includes an active pullup circuit, an active pulldown circuit, and an active grounding circuit. The digital logic of FIG. 5 is implemented in complementary logic (CMOS logic) using P-channel logic pull-up transistors and N-channel logic pull-down transistors.

The active pullup circuit couples the output terminal 25 to the positive supply voltage terminal 26 during the first period of time 35. This active pullup circuit includes the NAND gate and the first transistor Q1. If the digital logic level on the input terminal 24 is a digital logic high, and if the UVLO circuit 39 is outputting digital logic high signal onto the B input of the NAND gate indicating that the circuit is not to be disabled due to a low supply voltage condition, then the NAND gate outputs a digital logic low signal onto the gate of the first transistor Q1. Transistor Q1 is a P-channel transistor, so the low logic level on its gate causes transistor Q1 to be turned on and to stay on throughout the remainder of the first period of time 35. The pulldown transistor Q2 is off during this first period of time 35.

The active pulldown circuit drives the output terminal 25 to a negative voltage during the second period of time 36, and it does this in response to the digital input signal 19 on the input terminal 24 transitioning from the digital logic high level to the digital logic low level. During the first period of time 35, when the input control signal 19 is at a digital logic high level, the digital logic low signal on the output of the NAND gate causes transistor Q4 to turn on. As a result of transistor Q4 turning on, current flows from the positive supply voltage terminal VCC 26, through the conductive transistor Q4, through the CAP1 terminal 29, through the external capacitor 11 to CAP2 terminal 28, through diode 43, and out of the integrated circuit via the GND terminal 27. Because +15 volts is present on the VCC terminal 26, and because ground potential is on the GND terminal 27, the external capacitor 11 is charged up to approximately +15 volts. The voltage is actually smaller than +15 volts due to the voltage drop across the diode and a voltage drop across transistor Q4, but for simplicity purposes the voltage is represented to be +15 volts in the diagrams and explanation presented here. In this way, the external capacitor 11 is charged to about +15 volts during the first period of time 35.

At the beginning of the second period of time 36, transistor Q4 is turned off because the NAND gate asserts a digital logic high signal onto the NAND gate output. At the beginning of the second period of time, however, the AND gate AND1 asserts a digital logic high signal onto the gate of the second transistor Q2. It does this because there are digital logic high signals on all three of its input leads A, B and C. The digital logic high signal as output by AND1 is not only supplied to the gate of transistor Q2, but it is also supplied onto the gate of transistor Q5. This causes transistor Q5 to turn on and to couple the CAP1 terminal to the ground terminal GND 27. Because the external capacitor 11 was charged to +15 volts, the coupling of the CAP1 terminal 29 to ground potential causes the voltage on the CAP2 terminal 28 to be pushed down to about −15 volts. The CAP2 terminal 28 is coupled to the source S of the second transistor Q2, so there is now a −15 volt voltage present on the source of the second transistor Q2. The second transistor Q2 is conductive by virtue of the AND gate AND1 driving a high digital logic level onto the gate of transistor Q2. The −15 volts provided by the external capacitor 11 onto the CAP2 terminal 28 is therefore coupled to the output terminal 25. This causes the output terminal 25 to be "driven" to the negative voltage on the CAP2 terminal 28, which is approximately −15 volts. As a result, the voltage on the gate of the NFET 13 is discharged down to approximately −15 volts as illustrated in the waveform diagram of FIG. 4.

The active grounding circuit couples the output terminal 25 to the ground terminal 27 during the third period of time 37 while the digital logic low level is still present on the input terminal 24. The delay circuit 40 delays the high-to-low transition of the input signal on the IN terminal 24 for a substantially fixed period of time. In the present example, the substantially fixed period of time is about one hundred nanoseconds. At the end of this fixed period of time, there is a high-to-low transition of the delay signal 47 output by the delay circuit 40. This delay signal 47 is received onto the C input lead of the AND gate AND1. The low signal on the C input lead causes the AND gate AND1 to output a digital logic low signal, which in turn turns off the second transistor Q2. This prevents the second transistor Q2 from continuing to drive the output terminal to the negative voltage on the CAP2 terminal 28. The digital logic low voltage being output by the AND gate AND1 also is supplied onto the input lead of inverter 42. As a result, there is now a digital logic high signal on the B input lead of the AND gate AND2. Because the input signal on the IN terminal is at a digital logic low level, the signal on the A input lead of the NAND gate is a digital logic low level, and the NAND gate is supplying a digital logic high signal onto the A input lead of the AND gate AND2. Because the signals on both the A and B input leads of the AND gate AND2 are at digital logic high levels, the AND gate AND2 outputs a digital logic high signal. This causes transistor Q3 to turn on, thereby coupling the output terminal 25 to the ground terminal 27. This causes the voltage on the gate of the NFET 13 to be pulled up to ground potential at the beginning of the third period of time 37. Throughout the remainder of the third period of time 37, transistor Q3 is on and the output terminal 25 remains coupled to the ground terminal 27.

If there is an undervoltage condition detected by the UVLO circuit 39, then the UVLO circuit 39 outputs a digital logic low signal so as to disable the gate driver integrated circuit 10 from driving a non-zero voltage onto its output terminal 25. The digital logic low signal causes transistors Q1 and Q2 to be off and non-conductive. The gate driver integrated circuit 10 cannot therefore drive the gate of NFET 13 to either a positive voltage or to a negative voltage. Transistor Q3 is turned on so that the output terminal OUT 25 is coupled to ground potential.

In one example, the active pullup circuit includes: NAND, Q1; the active pulldown circuit includes: 41, 40, AND1, Q2, Q5, Q4, 29, 28, 43; the active grounding circuit includes: 42, AND2, Q3.

Figure 6:
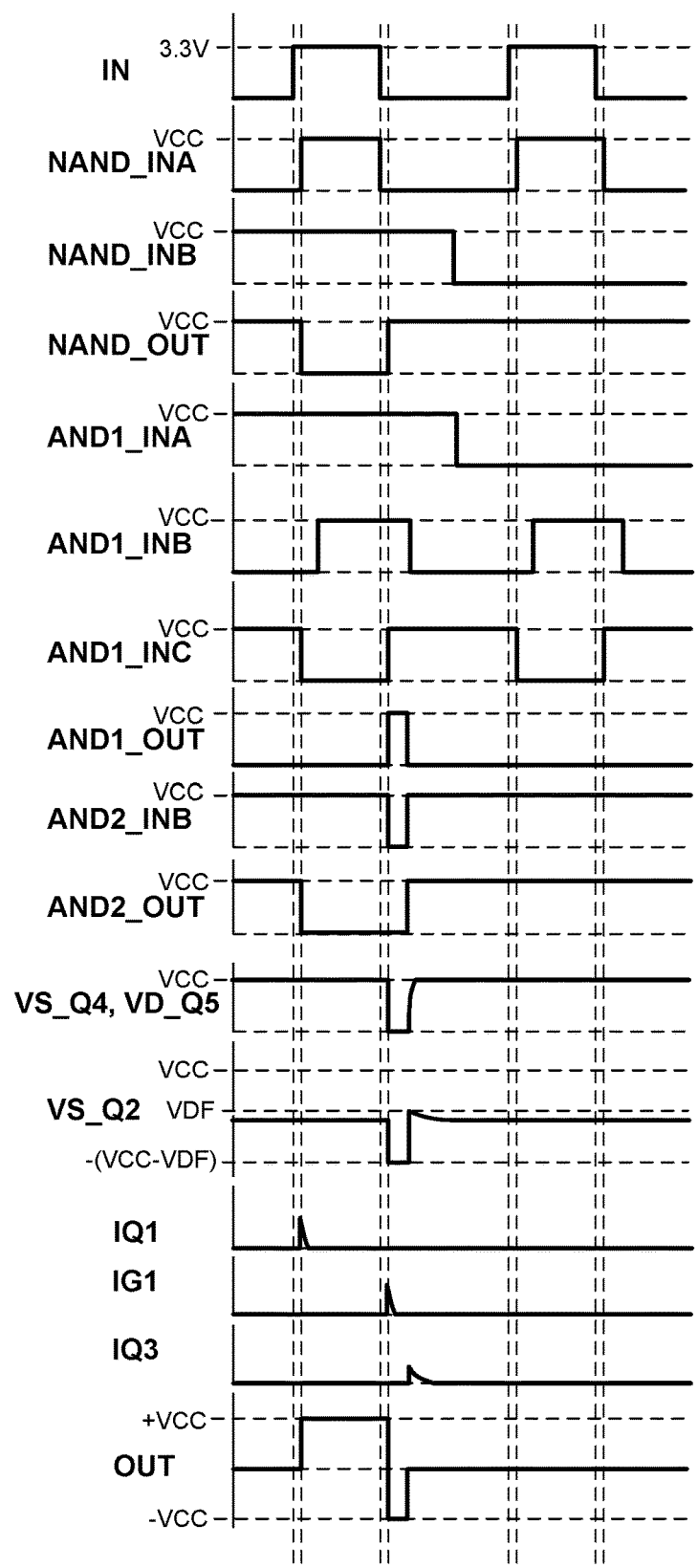
FIG. 6 is a waveform diagram that illustrates the waveforms of various signals in the gate driver integrated circuit of FIG. 5.

FIG. 6 is a waveform diagram that illustrates an operation of the circuit of FIG. 5. In the nomenclature used in naming signals on the waveform diagram, IN is the voltage signal present on input terminal IN 24. OUT is the voltage signal present on the output terminal OUT 25. NAND_INA is the signal present on the input lead A of the NAND gate. NAND_INB is the signal present on the input lead B of the NAND gate. NAND_OUT is the signal present on the output lead of the NAND gate. AND1_INA, AND1_INB and AND1_INC are the input signals present on the input leads A, B and C of the AND gate AND1, respectively. AND1_OUT is the signal present on the output lead of the AND gate AND1. AND2_INB is the signal present on the input lead B of the AND gate AND2. AND2_OUT is the signal present on the output of the AND gate AND2. VS_Q4 is the voltage signal present on the source electrode and lead of the transistor Q4. VD_Q5 is the voltage signal present on the drain electrode and lead of the transistor Q5. VS_Q2 is the voltage signal present on the source electrode and lead of the transistor Q2. IQ1, IQ2 and IQ3 are the currents flowing through transistors Q1, Q2 and Q3, respectively.

Figure 7:
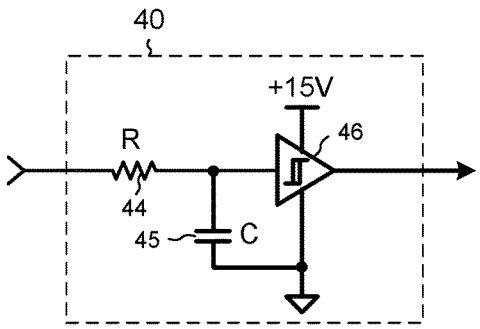
FIG. 7 is a circuit diagram of one example of the delay circuit 40 of FIG. 5.

FIG. 7 is a circuit diagram of one example of the delay circuit 40 of FIG. 5. The time delay of the delay circuit 40 is set by the RC time constant due to the resistance R of resistor 44 and the capacitance C of capacitor 45. Component 46 is a CMOS logic Schmidt trigger non-inverting buffer. The entire circuit of FIG. 7 is integrated onto the gate driver integrated circuit 10.

Figure 8:
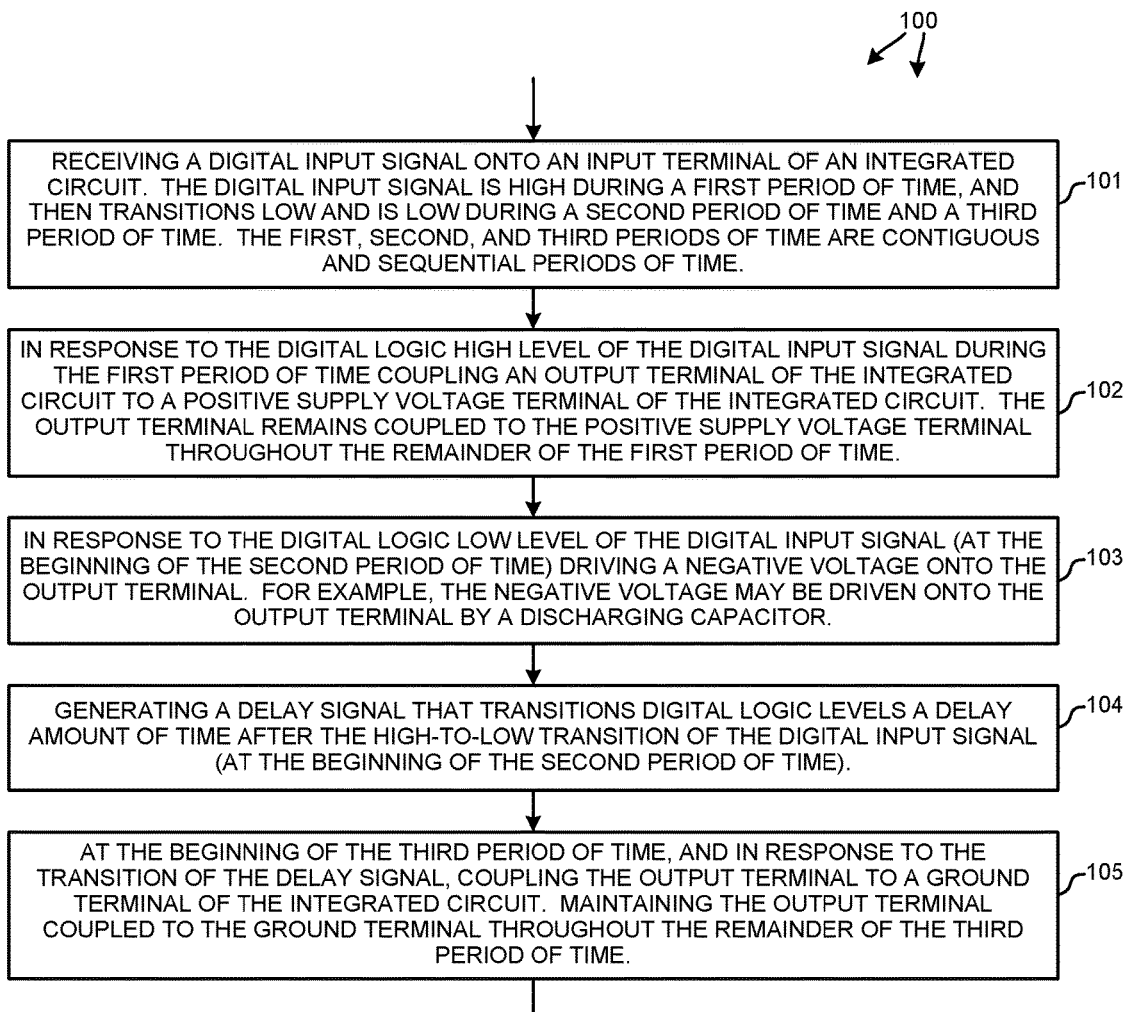
FIG. 8 is a flowchart of a method in accordance with one novel aspect.

FIG. 8 is a flowchart of a method 100 in accordance with one novel aspect. In step 101, the digital input signal 19 is received onto the IN terminal 24 of the gate driver integrated circuit 10. The digital input signal 19 is high during the first period of time 35, is low during the second period of time 36, and is low during the third period of time 37. The digital input signal 19 is as shown in the upper waveform of FIG. 4.

In step 102, in response to the digital logic high level of the digital input signal 19 during the first period of time 35, the gate driver integrated circuit 10 couples the output terminal 25 to the positive supply voltage terminal 26. The output terminal 25 remains coupled to the positive supply voltage terminal 26 throughout the remainder of the first period of time 35.

In step 103, in response to the digital logic level of the digital input signal 19 (at the beginning of the second period of time 36), the gate driver integrated circuit 10 "drives" a negative voltage onto the output terminal 25. In the case of the circuit of FIG. 5, the gate driver integrated circuit 10 does this by charging the external capacitor 11 during the first period of time 35, and then coupling the external capacitor 11 so that the external capacitor 11 puts a voltage of about −15 volts onto the CAP2 terminal 28, and also coupling the CAP2 terminal 28 to the source of transistor Q2. Transistor Q2 is turned on during the second period of time 36, so this results in the output terminal 25 being coupled to a source of the negative voltage. The external capacitor in this case is referred to as being a source of the negative voltage even though it is passive capacitor and the negative voltage on the CAP2 terminal 28 becomes less negative as current is pulled from the output terminal OUT 25. The pulling of current from output terminal OUT 25 is said to "drive" the output terminal OUT 25 down to the negative voltage. The terms "drive", "drives" and "driving" in this patent document are to be given broad meanings that encompass the above-described operation involving external capacitor 11.

In other circuit examples, the gate driver integrated circuit 10 may have a negative supply voltage terminal $-V_{CC}$, and the output terminal OUT 25 is driven to the negative voltage by coupling the output terminal OUT 25 to this negative supply voltage terminal $-V_{CC}$. An external voltage source or external power supply, that is external to the gate driver integrated circuit 10, would supply the negative voltage (for example, −15 volts) on the negative supply voltage terminal $-V_{CC}$. There are many ways that the voltage on the output terminal OUT 25 can be driven down to the negative voltage during the second period of time.

In step 104, a delay signal is generated. This delay signal transitions digital logic levels a predetermined and fixed delay amount of time after the high-to-low transition of the digital input signal 19 (at the beginning of the second period of time). In the example of the circuit of FIG. 5, this transition of the delay signal is a high-to-low transition of the delay signal 47 as supplied onto the C input lead of AND gate AND1. In step 105, at the beginning of the third period of time 37, and in response to the transition of the delay signal, the gate driver integrated circuit 10 couples the output terminal 25 to the ground terminal 27. The output terminal 25 remains coupled to the ground terminal 27 throughout the remainder of the third period of time 37. At any given time in the method 100 of FIG. 8, the output terminal 25 is being driven to only one of the following voltages: the positive voltage (for example, +15 volts) of the positive supply voltage terminal 26, the negative voltage (for example, −15 volts) provided by the external capacitor 11, and the ground potential of the ground terminal 27. The phrase "at the beginning" as it is used here in describing when the output terminal 25 is coupled to the ground terminal 27 does not mean at the beginning instant, but rather means at the beginning portion of the second period of time 36 as is evident from the waveform diagram of FIG. 4. It is understood that the coupling of the output terminal 25 to the ground terminal 27 occurs in response to the high-to-low transition of the digital input signal 19 and therefore necessarily occurs slightly after the very beginning instant of the second period of time 36.

It is to be understood that the so-called "steps" of the method of FIG. 8 are not necessarily sequential steps that have to occur in a strict sequential fashion. For example, the first block 101 of FIG. 8 describes the digital input signal waveform, and this digital input signal exists throughout the first, second and third periods of time. Accordingly, actions called out in one block of FIG. 8 overlap in time with actions called out other blocks of FIG. 8. The terms and the phraseology of the text of FIG. 8 are to be interpreted to be consistent with operation of the gate driver integrated circuit 10 in how it receives the digital input waveform 19 at the top of FIG. 4 and in how it outputs the waveform of signal 20 at the bottom of FIG. 4.

Although an embodiment has been described above that employs an active grounding circuit to charge the gate of NFET 13 from the negative voltage up to ground potential in the third period of time 37, other circuits can be employed that involve passive circuits to charge the gate of NFET 13 up to ground potential in the third period of time 37. Also, although an embodiment of the gate driver integrated circuit has been described above that does not have a negative supply voltage terminal (but rather uses the external capacitor 11 in a charge pump fashion to produce a negative voltage), other circuits can be employed that do have a negative supply voltage terminal $-V_{CC}$ and that do drive the output terminal OUT to the negative voltage during the second period of time by coupling the output terminal OUT to the negative supply voltage terminal $-V_{CC}$ during the second period of time.

Figure 9:
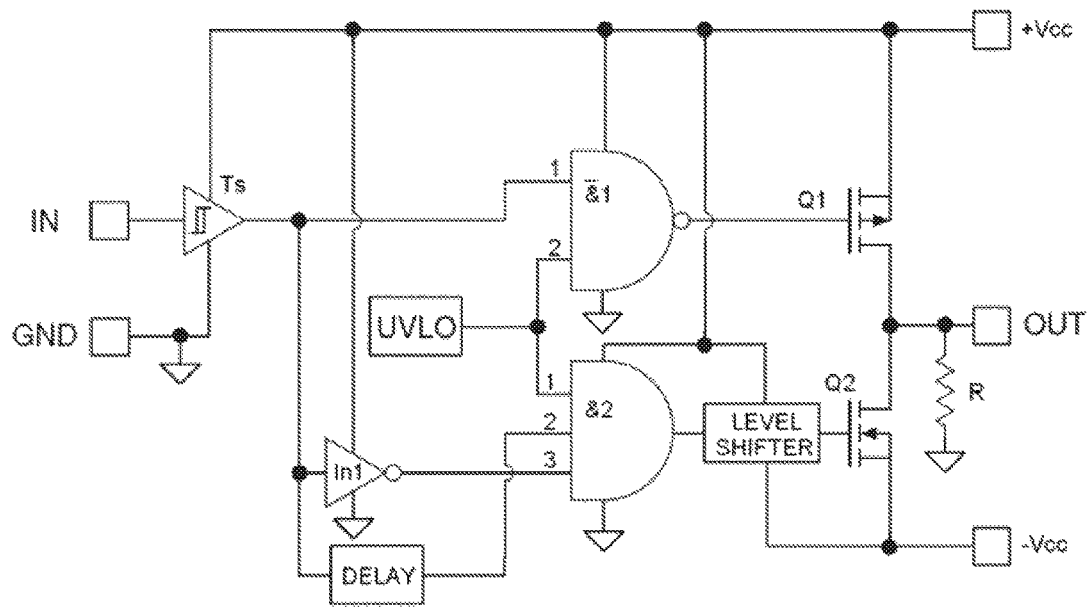
FIG. 9 is a circuit diagram of a second embodiment of a gate driver integrated circuit.

FIG. 9 is a circuit diagram of a second embodiment of a gate driver integrated circuit. This embodiment has a negative supply voltage terminal (labeled $-V_{cc}$ in the diagram) and employs passive charging to ground potential. This is a terminal of the gate driver integrated circuit. There is no active grounding circuit, but rather in the third period of time the output terminal OUT (and on the gate of the NFET being driven) is charged from the negative supply voltage up to ground potential via resistor R. The voltage on the gate of the NFET is raised up to ground potential at the beginning of the third period of time with an RC circuit waveform as determined by the resistance of the resistor R and the capacitance of the gate of the NFET. The resistor R can be provided on-chip as illustrated, or can be provided external to the gate driver integrated circuit.

Figure 10:
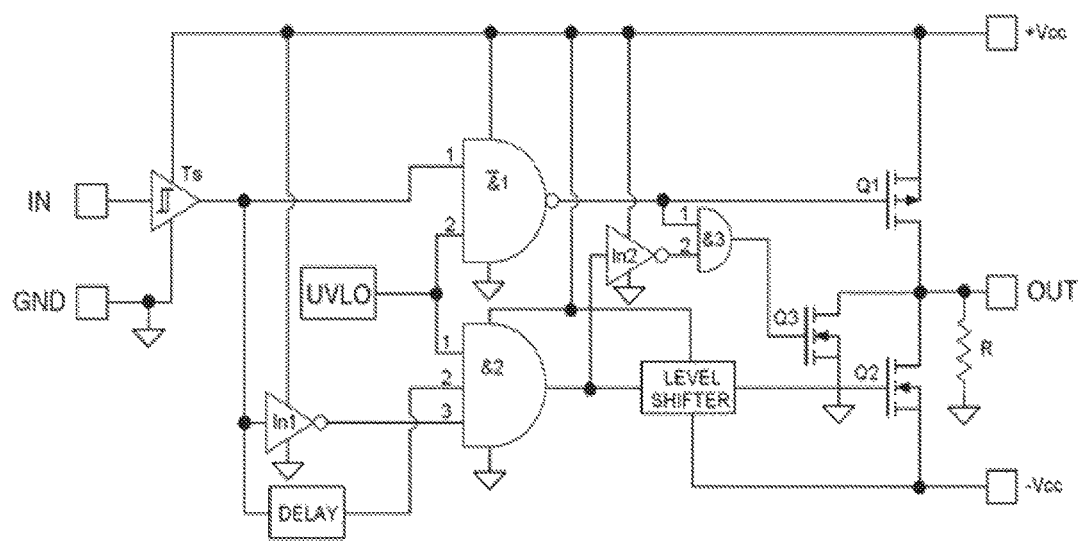
FIG. 10 is a circuit diagram of a third embodiment of a gate driver integrated circuit.

FIG. 10 is a circuit diagram of a third embodiment of a gate driver integrated circuit. This embodiment also has a negative supply voltage terminal (labeled $-V_{cc}$ in the diagram), but it does have an active grounding circuit. The active grounding circuit includes inverter In2, AND gate &3, and transistor Q3. The resistor R has a larger resistance that the resistance of resistor R in the case of the second embodiment of FIG. 9. In the embodiment of FIG. 10, the resistor R is not provided to charge the gate of the NFET up to ground potential at the beginning of the third period of time all by itself, but rather is provided to prevent a potential catastrophic failure of the external NFET in the event the driver integrated circuit active circuitry is for some reason not driving the NFET gate during a time when the overall power supply is powered. If the overall power supply were powered and if the NFET were inadvertently allowed to be turned on or otherwise left on and conductive, the result could be a failure of the NFET or another part of the power supply circuit. Typically the NFET is only switching on for periods of short duration and if the NFET were left on for a longer continuous period then it would overheat and destroy itself. The resistor R is provided in the circuit of FIG. 10 to charge, or to discharge, the gate to a harmless zero volts in the event that the gate driver integrated circuit is not enabled and is not driving the gate of the NFET in a controlled fashion. This safety resistor R can be provided on-chip as illustrated, or can be provided external to the gate driver integrated circuit.

Figure 11:
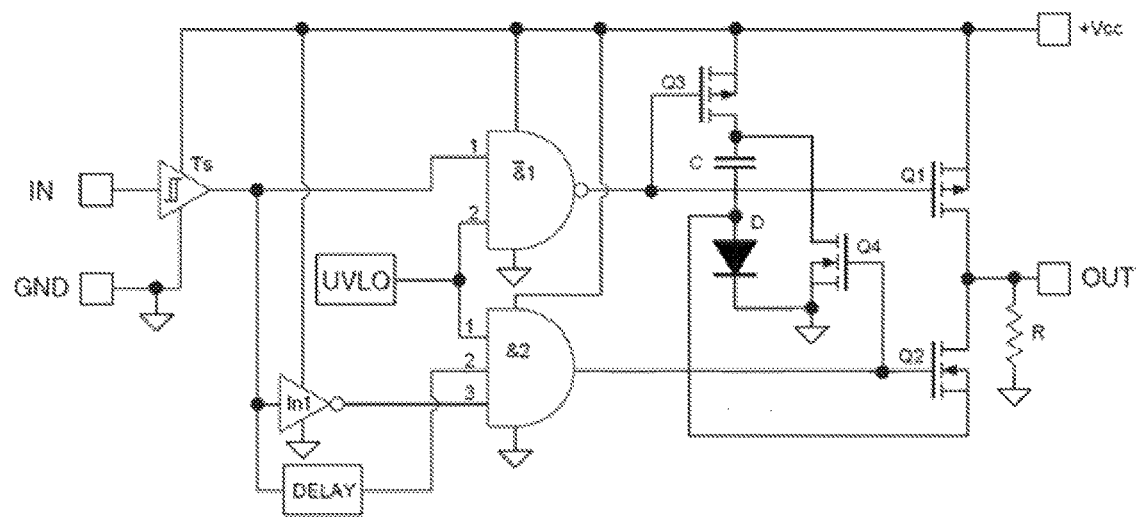
FIG. 11 is a circuit diagram of a fourth embodiment of a gate driver integrated circuit.

FIG. 11 is a circuit diagram of a fourth embodiment of a gate driver integrated circuit. This embodiment does not have and does not need a negative supply voltage terminal $-V_{CC}$. Rather, a capacitor C is used in a charge pump fashion to generate the necessary negative voltage on-chip. The capacitor C can be provided on-chip, or can be provided off chip by providing two capacitor connection terminals CAP1 and CAP2 as shown in FIG. 2. The embodiment of FIG. 11 does not have an active grounding circuit. Rather, the grounding of the gate of the NFET to ground potential during the third period of time is performed by the resistor R. The resistor R can be provided on-chip as illustrated, or can be provided external to the gate driver integrated circuit.

Figure 12:
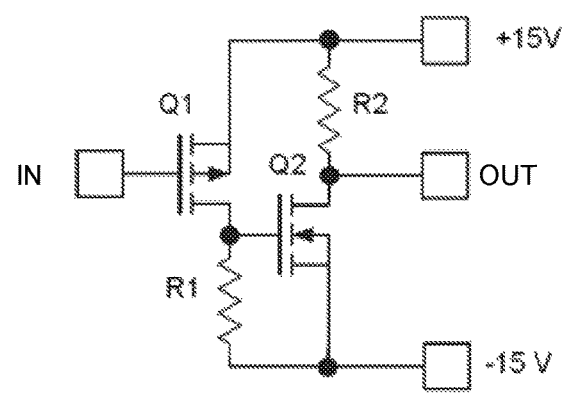
FIG. 12 is a circuit diagram of a level shifter circuit suitable for use as the level shifter circuit in the embodiment of FIG. 9 and in the embodiment of FIG. 10.

FIG. 12 is a circuit diagram of a level shifter circuit suitable for use as the level shifter circuit in the embodiment of FIG. 9 and in the embodiment of FIG. 10. The +15V terminal is not really a terminal, but rather denotes a connection to a conductor or node on the gate driver integrated circuit 10 where there is +15 volts present. Likewise, the −15V terminal is not really a terminal, but rather denotes a connection to a conductor or node on the gate driver integrated circuit 10 where there is a −15 volts present. IN is the input node of the level shifter circuit and OUT is the output node of the level shifter circuit.

Figure 13:
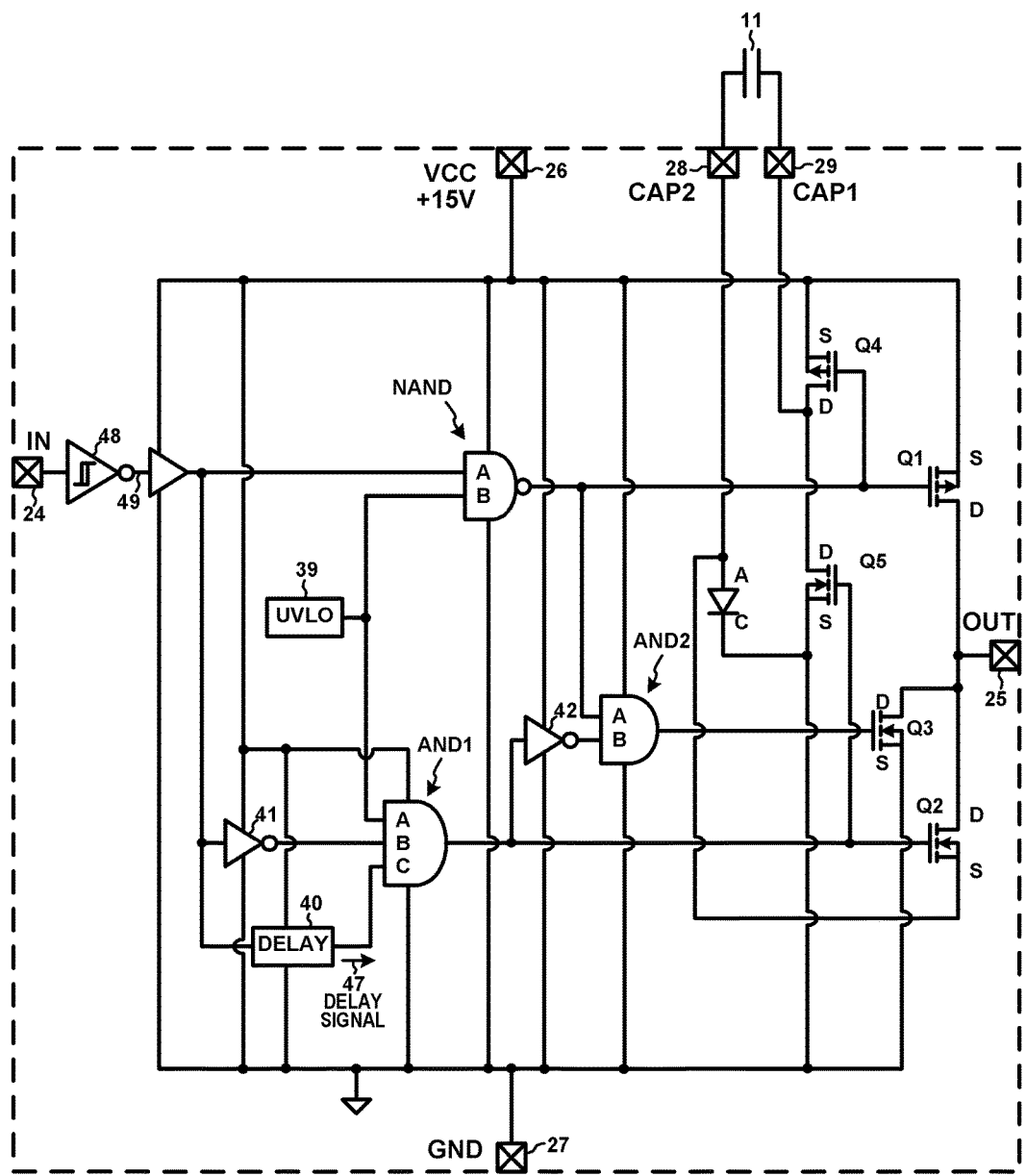
FIG. 13 is a circuit diagram of an embodiment in which the gate driver integrated circuit receives a digital logic input control signal of opposite polarity as compared to the digital logic input control signal 19 received onto the input terminal 24 of FIG. 5.

FIG. 13 is a circuit diagram of an embodiment in which the gate driver integrated circuit receives a digital logic input control signal of opposite polarity as compared to the digital logic input control signal 19 received onto the input terminal 24 of FIG. 5. As compared to the circuit of FIG. 5, there is an additional logic inversion in the digital logic input control signal input path. The additional inversion is provided by an inverting logic element, which in this case is a Schmidt trigger 48. The polarity of the signal on the input node 49 is the same as shown in FIG. 4. The output lead of inverting Schmidt trigger 48 is coupled to and is part of input node 49. The input lead of inverting Schmidt trigger 48 is coupled to the input terminal 24. The input node could also be an internal node present within a non-inverting buffer circuit, where the buffer circuit actually includes two inverting stages. The embodiment of FIG. 13 is presented to make clear that the digital logic input control signal received on the input terminal of the novel gate driver integrated circuit may be of the polarity illustrated in FIG. 4, and alternatively may be of the opposite polarity.

Although certain specific embodiments are described above for instructional purposes, the teachings of this patent document have general applicability and are not limited to the specific embodiments described above. The circuitry of the gate driver integrated circuit can be integrated along with the circuitry of the NFET onto one integrated circuit die. The circuitry of the gate driver integrated circuit can be packaged in the same semiconductor device package along with a discrete NFET die. Likewise, the external capacitor 11 can be packaged in the same semiconductor device package along with the gate driver integrated circuit die. Although a three output voltage gate driver integrated circuit is described above for driving an N-channel power transistor, the same three output voltage gate driver scheme can be employed in a three output voltage gate driver integrated circuit for driving the gate of a P-channel power transistor. To turn the P-channel transistor off, the turn off voltage applied to the gate is initially of higher magnitude, but then after the delay time the gate voltage is reduced in anticipation of turning the P-channel transistor on again. A circuit for driving an N-channel power transistor and a circuit for driving a P-channel power transistor can both be integrated onto the same integrated circuit and be packaged into the same semiconductor package. The gate driver integrated circuit can be digitally controlled and can have a preset digital setting. For example, the delay introduced that sets the duration of the second period of time can be digitally programmable delay, and can have a default and pre-programmed initial digital value setting. The pre-programmed initial setting can then be overwritten under digital control. The gate driver circuitry, including such a digitally programmable delay element, can be integrated onto a microcontroller integrated circuit. Accordingly, various modifications, adaptations, and combinations of various features of the described embodiments can be practiced without departing from the scope of the invention as set forth in the claims.

What is claimed is:

1. A gate driver integrated circuit comprising:
an input terminal that receives a digital input signal, wherein the digital input signal has a digital logic high level during a first period of time and transitions to a digital logic low level so that the digital input signal has a digital logic low level during a second period of time, and wherein the digital input signal does not transition digital logic levels between the second period of time and a third period of time such that the digital input signal maintains the digital logic low level into and throughout the third period of time;
an output terminal;
a positive supply voltage terminal, wherein a positive supply voltage is received onto the positive supply voltage terminal, wherein the positive supply voltage is greater than any voltage of the digital input signal as received onto the input terminal;
a ground terminal;
an active pullup circuit that couples the output terminal to the positive supply voltage terminal during the first period of time;
an active pulldown circuit that drives the output terminal to a negative voltage during the second period of time in response to the digital input signal on the input terminal transitioning from the digital logic high level to the digital logic low level; and
an active grounding circuit that couples the output terminal to the ground terminal during the third period of time while the digital logic low level is still present on the input terminal, wherein the active pulldown circuit comprises a delay circuit, and wherein the delay circuit outputs a signal that determines when the active pulldown circuit stops driving the output terminal to the negative voltage and when the active grounding circuit begins coupling the output terminal to the ground terminal.

2. The gate driver integrated circuit of claim 1, further comprising:
a first capacitor terminal; and
a second capacitor terminal, wherein the active pulldown circuit causes a capacitor coupled to the first and second capacitor terminals to be charged during the first period of time and causes the first capacitor terminal to be coupled to the ground terminal during the second period of time and causes the second capacitor terminal to be coupled to the output terminal during the second period of time.

3. The gate driver integrated circuit of claim 1, further comprising:
a negative supply voltage terminal, wherein the active pulldown circuit couples the negative supply voltage terminal to the output terminal during the second period of time.

4. The gate driver integrated circuit of claim 1, wherein the active pullup circuit comprises a field effect transistor, wherein a first terminal of the field effect transistor is coupled to the positive supply voltage terminal, and wherein a second terminal of the field effect transistor is coupled to the output terminal.

5. The gate driver integrated circuit of claim 1, wherein the active pullup circuit comprises a field effect transistor through which the active pullup circuit couples the positive supply voltage terminal to the output terminal during the first period of time.

6. The gate driver integrated circuit of claim 2, wherein the active pulldown circuit comprises a field effect transistor, wherein a first terminal of the field effect transistor is coupled to the output terminal, and wherein a second terminal of the field effect transistor is coupled to the second capacitor terminal.

7. The gate driver integrated circuit of claim 2, wherein the active pulldown circuit comprises a field effect transistor through which the active pulldown circuit couples the second capacitor terminal to the output terminal during the second period of time.

8. The gate driver integrated circuit of claim 3, wherein the active pulldown circuit comprises a field effect transistor through which the active pulldown circuit couples the negative supply voltage terminal to the output terminal during the second period of time.

9. The gate driver integrated circuit of claim 3, wherein the active pulldown circuit comprises a field effect transistor, wherein a first terminal of the field effect transistor is coupled to the output terminal, and wherein a second terminal of the field effect transistor is coupled to the negative supply voltage terminal.

10. The gate driver integrated circuit of claim 1, wherein the input terminal, the output terminal, the positive supply voltage terminal, and the ground terminal are bond pad terminals of the gate driver integrated circuit.

11. A gate driver integrated circuit comprising:
an input node onto which a digital input signal is received, wherein the digital input signal on the node has a digital logic high level during a first period of time and transitions to a digital logic low level so that the digital input signal has a digital logic low level during a second period of time, and wherein the digital input signal does not transition digital logic levels between the second period and a third period such that the digital input signal maintains the digital logic low level into and throughout the third period;
an output terminal;
an active pullup circuit that drives the output terminal to a positive voltage during the first period of time in response to the digital input signal being at the digital logic high level during the first period of time;
an active pulldown circuit that drives the output terminal to a negative voltage during the second period of time in response to the digital input signal on the input node transitioning from the digital logic high level to the digital logic low level; and
an active grounding circuit that drives the output terminal to ground potential during the third period of time while the digital logic low level is still present on the input node, wherein the gate driver integrated circuit comprises a delay circuit that causes the active pulldown circuit to stop driving the output terminal to the negative voltage and that causes the active grounding circuit to start driving the output terminal to ground potential.

12. The gate driver integrated circuit of claim 11, wherein the input node is an input terminal of the gate driver integrated circuit.

13. The gate driver integrated circuit of claim 11, wherein the input node is driven by an inverting logic element, and wherein an input lead of the inverting logic element is coupled to an input terminal of the gate driver integrated circuit.

14. The gate driver integrated circuit of claim 11, wherein the active pullup circuit drives the output terminal such that a voltage on the output terminal at the end of the first period of time is a substantially stable positive voltage, wherein the active pulldown circuit drives the output terminal such that a voltage on the output terminal at the end of the second period of time is a negative voltage, and wherein the active grounding circuit drives the output terminal such that a voltage on the output terminal at the end of the third period of time is a substantially stable zero volts.

15. The gate driver integrated circuit of claim 11, wherein the active pulldown circuit comprises a capacitor charge pump circuit.

16. The gate driver integrated circuit of claim 10, wherein the gate driver integrated circuit is housed within a semiconductor device package, wherein the semiconductor device package has package terminals, and wherein each of the input terminal, the output terminal, the positive supply voltage terminal, and the ground terminal is coupled to a corresponding one of the package terminals of the semiconductor device package.

* * * * *